United States Patent

Fujishima et al.

[15] 3,648,184

[45] Mar. 7, 1972

[54] FM DETECTING CIRCUIT HAVING A PIEZOELECTRIC FILTER

[72] Inventors: Satoru Fujishima; Hideo Homma, both of Kyoto-fu, Japan

[73] Assignee: Murata Manufacturing Co., Ltd., Kyoto-fu, Japan

[22] Filed: Aug. 14, 1969

[21] Appl. No.: 850,099

[30] Foreign Application Priority Data

Aug. 14, 1968 Japan....................................43/57854
Feb. 14, 1969 Japan....................................44/11329

[52] U.S. Cl...............................................329/198, 329/117
[51] Int. Cl...............................................H03d 1/00
[58] Field of Search..................329/117, 124, 126, 150, 198; 325/318, 489; 333/72; 331/116

[56] References Cited

UNITED STATES PATENTS

| | | | |
|---|---|---|---|
| 3,307,118 | 2/1967 | Svec | 331/116 X |
| 3,155,913 | 11/1964 | Prenosil et al. | 329/117 |
| 3,206,692 | 9/1965 | Fogle et al. | 333/72 X |
| 3,421,109 | 1/1969 | Wiggins et al. | 333/72 X |

*Primary Examiner*—Roy Lake
*Assistant Examiner*—Lawrence J. Dahl
*Attorney*—Craig, Antonelli & Hill

[57] ABSTRACT

An FM detecting circuit comprises a band pass filter composed of at least one piezoelectric resonator having three electrodes or a plurality of piezoelectric resonators having two electrodes and a transistor.

The output voltage of the transistor is increased or decreased in proportion to the difference between the phases of the input and output voltages of the band pass filter, whereby the phase detection of the input voltage can be achieved.

12 Claims, 11 Drawing Figures

Patented March 7, 1972

3,648,184

3 Sheets-Sheet 1

FM DETECTING CIRCUIT HAVING A PIEZOELECTRIC FILTER

This invention relates to FM detecting circuits which can be used in audio detectors in television or an FM radio receiver, and more particularly to FM detecting circuits wherein piezoelectric band pass filters made of piezoelectric materials such as ceramic materials or quartz crystals and transistors are used as its principal elements.

Heretofore, the FM detector employing a piezoelectric resonator has utilized an impedance-frequency characteristic of a piezoelectric resonator having two electrodes as shown in FIG. 1 which varies linearly as shown in FIG. 2 in a portion between points *a* and *b* within the frequency band between a resonance frequency $f_r$ and an antiresonance frequency $f_a$. To be more particular in FIG. 1, the FM detector has performed its function utilizing a potential difference between a piezoelectric resonator Xo having two electrodes and a series capacitor Co which capacitance is nearly equal to the static capacitance of the resonator, and two diodes $D_1$ and $D_2$ have been employed as rectifying elements thereof.

However, because of the fact that the impedance-frequency characteristic of the piezoelectric resonator has a significant degree of nonlinearity near the resonance frequency $f_r$ and the antiresonance frequency $f_a$ as shown in FIG. 2, there is only a narrow portion in the frequency band which has good linearity, and for this reason it has been difficult to obtain an FM detecting circuit having a good linearity over a comparatively wide frequency band. For instance, a comparatively good characteristic of a conventional detecting circuit employing a ceramic piezoelectric resonator, when it is employed in the audio detector circuit of a television receiver, may lie in a frequency range of −25 to +25 kHz. maximum around the center frequency of 4.5 MHz., and although this may satisfy the minimum operating requirement of the detector, such a narrow frequency band cannot be considered satisfactory when the variation of the characteristics due to the temperature or other factors is taken into consideration.

In the case of the FM radio, for example, since the deviation of the intermediate frequency is in a range of 10.7 MHz. ± 75 kHz., a linearity in a range of about −100 to +100 kHz. around the center frequency 10.7 MHz. is necessary in order to allow for temperature variations. However, the linearity in the output characteristic of the conventional FM detecting circuit is at best in range of −50 to +50 kHz. around the center frequency 10.7 MHz., thus being far short of the wide band requirement.

The conventional FM detecting circuit also has a shortcoming that magnitude of the output voltage has a maximum limit.

Therefore, the primary object of the present invention is to provide an FM detecting circuit which is composed of a piezoelectric band pass filter and a transistor, is simple in construction, has good linearity in its output characteristic in a wide frequency band and thus, is capable of producing large output voltages.

Another object of the present invention is to provide a phase detecting circuit which contains a band pass filter composed of a plurality of piezoelectric resonators and having an improved linear phase angle versus frequency characteristic in the detected output over a wide frequency band.

Still another object of the invention is to provide an FM detecting circuit which includes at least one transistor as its rectifying element, thus having minimum distortion in the audio frequency range of the output and rendering a comparatively high output voltage.

An additional object of the invention is to provide an FM detecting circuit composed of a piezoelectric filter and at least one transistor, whereby the size of the detecting circuit is kept at a minimum, thus enabling it to be combined into a hybrid integrated circuit. Since the detecting circuit does not employ a coil, no particular alignment is necessary and thus the construction thereof may be simplified compared to conventional FM detecting circuits.

The invention in general contemplates an FM detecting circuit comprising a band pass filter composed of a plurality of piezoelectric resonators having two electrodes or at least one piezoelectric resonator having three electrodes, thus obtaining a detected output proportional to the phase difference between the output and input voltages of the band pass filter.

These and other objects may be better achieved by a novel construction of an FM detecting circuit in accordance with the present invention which will be better understood when read in conjunction with the accompanying drawings, in which.

In the FM detecting circuit according to the present invention, there is employed a band pass filter composed of piezoelectric resonators made of a monocrystalline piezoelectric material including a quartz crystal, Rochelle salt, dipotassium tartrate (DKT), lithium sulfate, etc., or made of a ferroelectric ceramic materials such as barium titanate, lead zirconate-lead titanate, or various chemical modifications thereof.

Figure 3:
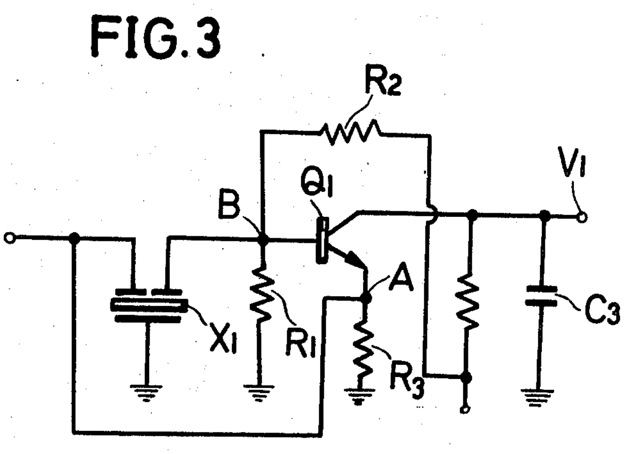
FIG. 3 is a circuit diagram of an FM detecting circuit constituting an embodiment of the present invention, wherein a piezoelectric resonator having three electrodes is employed.
Figure 3A:
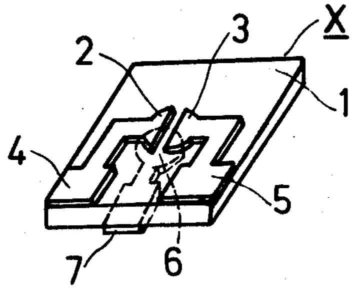
FIG. 3A is a perspective view of a piezoelectric resonator having three electrodes employed in the present invention.

A band pass filter composed of a piezoelectric resonator is indicated for instance by FIG. 3A wherein a most simple split-electrode form of piezoelectric resonator X is employed. In FIG. 3A, there is indicated a thin plate 1 consisting of a piezoelectric substance, on one surface of which there are provided two electrodes 2 and 3, terminals 4 and 5 connected respectively to the electrodes 2 and 3, and on the other side surface of which there are provided a common electrode 6 at a location opposite to the electrodes 2 and 3 and a terminal 7 connected to the electrode 6. In this form of resonator having three electrodes, electrodes 2 and 3 are provided closely each other so that the vibration of resonant parts, which consist of a thin plate of piezoelectric material electrodes 2 and 6 and having electrodes 3 and 6, may be coupled together mechanically in the plate.

Figure 3B:
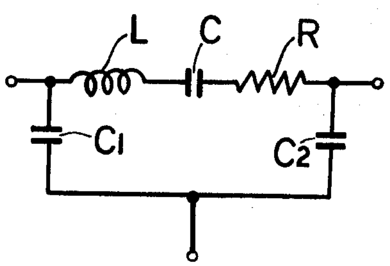
FIG. 3B is an equivalent circuit of the piezoelectric resonator indicated in FIG. 3A.

FIG. 3B illustrates an equivalent circuit of the piezoelectric resonator X, wherein $C_1$ and $C_2$ represent static capacitance at the input side and the output side of the resonator X, and L, C, and R represent respectively an equivalent inductance, compliance, and resistance of the resonator X when the resonator vibrates mechanically in resonance frequency. When the mechanical Q of the substance is very high, the resistance R may be neglected and the upper frequency $f_2$ and the lower frequency $f_1$ of the pass band are expressed as;

$$f_1 = \frac{1}{2\pi\sqrt{LC}}$$

and $$f_2 = \frac{1}{2\pi\sqrt{LC\left(\frac{C_1C_2}{C_1C_2+CC_1+CC_2}\right)}}$$

Figures 3C, 3D, 3E:
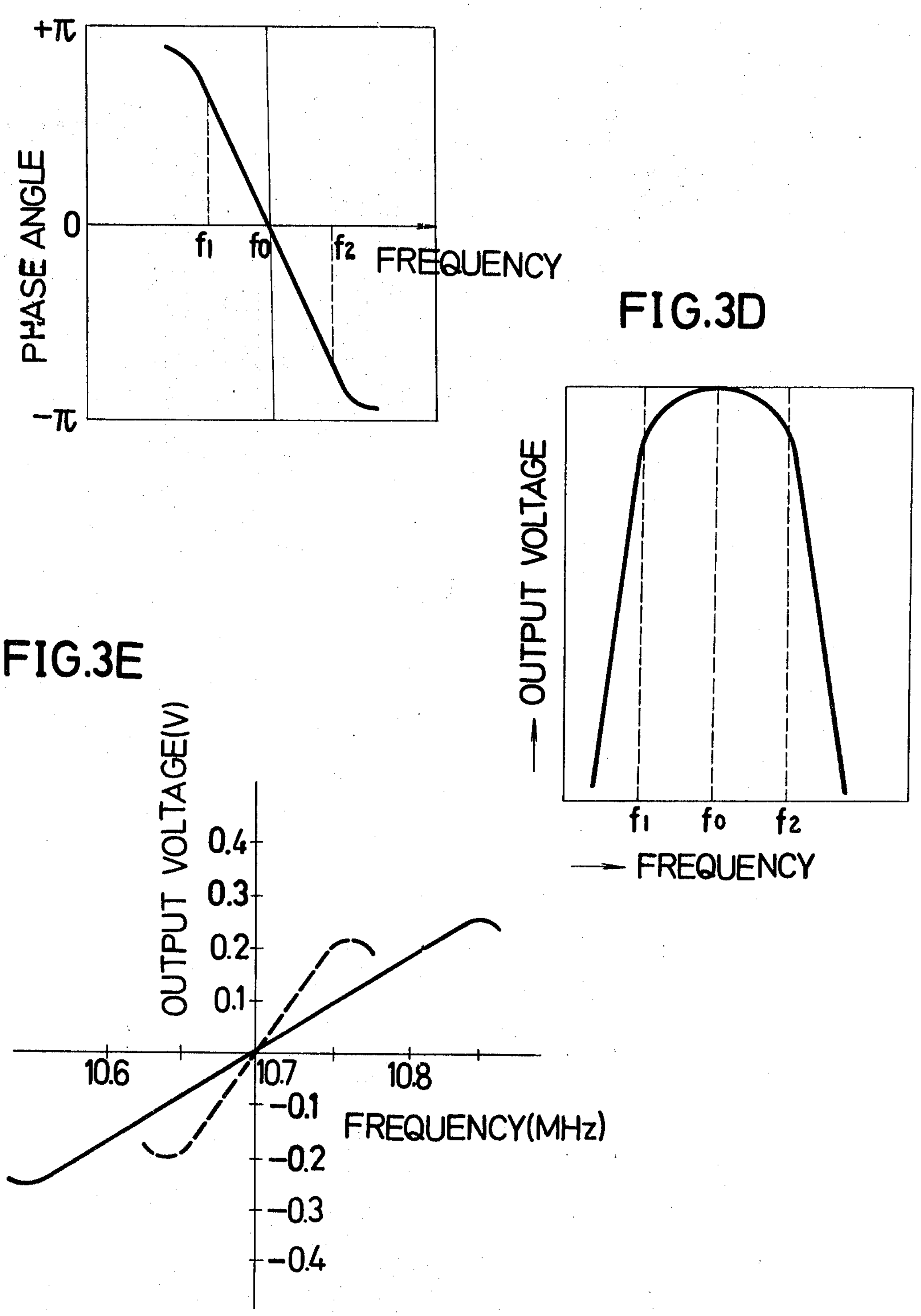
FIG. 3C depicts the phase frequency characteristic of a band pass filter comprising the above described piezoelectric resonator having three electrodes.
FIG. 3D depicts the output voltage frequency characteristic of a piezoelectric having three electrodes.
FIG. 3E depicts a graphical comparison between the detecting characteristics of the embodiment shown in FIG. 3 and of the conventional construction shown in FIG. 1.

Assuming that the center frequency is, $$f_0 = \sqrt{f_1f_2} \fallingdotseq \frac{f_1+f_2}{2},$$

then the phase difference between the output voltage and the input voltage will be as indicated in FIG. 3C. To be more particular, the piezoelectric resonator having three electrodes can be employed as a band pass filter wherein the phase difference between the input and output becomes zero at the center frequency $f_o$, and in a wide frequency range well exceeding the upper and lower frequencies $f_2$ and $f_1$, the phase-frequency characteristic has a good linearity.

Figure 2:
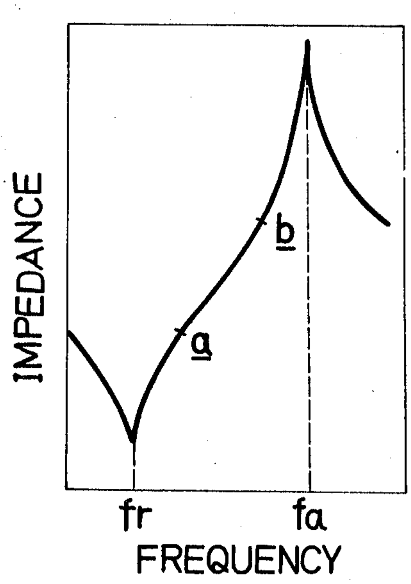
FIG.2 PRIOR ART
FIG. 2 depicts the impedance frequency characteristic of a piezoelectric resonator having two electrodes.

Since the conventional piezoelectric resonator having two electrodes has the frequency-impedance characteristic in FIG. 2, the characteristic has significant nonlinearity near the resonance frequency $f_r$ and the antiresonance frequency $f_a$, and accordingly, in the prior art there is only a narrow portion in the frequency band which has good linearity between the points *a* and *b*.

For this reason, if the resonator is employed in FM detecting circuits, a modulated wave may be detected only in the narrower frequency range than the frequency range between the resonance frequency and the antiresonance frequency.

However, the piezoelectric resonator having three electrodes according to this invention and made of a material similar to that of the conventional having two electrodes has an output voltage frequency characteristic as shown in FIG. 3D, and the band width of its characteristic may be approximately equal to the difference of the resonance frequency $f_r$ and antiresonance frequency $f_a$. The phase-frequency characteristic of the band pass filter according to the present invention has an exceedingly good linearity in the frequency band of $f_1$ to $f_2$, and has a straight portion extending to a frequency lower than $f_1$ and an frequency higher than $f_2$, as shown in FIG. 3C. For this reason, although the impedance frequency characteristic of the conventional resonator having two electrodes is useful for detecting only signals lying in the narrow portion of the frequency band between the two frequencies, the phase-frequency characteristic of the resonator having three electrodes according to the present invention may be useful for detecting in a frequency range wider than said range.

Likewise, in other examples of the band pass filters constructed from a plurality of piezoelectric resonators having two electrodes or a plurality of piezoelectric resonators having three electrodes, the phase-frequency characteristics are similar to that indicated in FIG. 3C, and have good linearity in a wide frequency range with a center frequency $f_o$.

Since the phase difference between the input and output of the piezoelectric band pass filter varies rectilinearly over a wide frequency range centered at a frequency $f_o$, the FM detecting circuit according to the present invention is constructed to detect the above described phase difference between the input and the output of the band pass filter. To be more particular, an FM signal applied to the band pass filter according to this invention is inverted for a change in phase, which is inverted for a change in the output voltage by means at least one of transistor which is controlled by this phase. At the same time, the output voltage may be detected and amplified by means of the transistor.

FIG. 3 shows an example of FM detecting circuit according to the invention, wherein a piezoelectric resonator having three electrodes is employed. In FIG. 3, reference characters $X_1$ and $Q_1$ designate a piezoelectric resonator having three electrodes constituting a band pass filter and a transistor for amplifying and detecting, respectively. Now, if the input voltage of the band pass filter $X_1$ is connected to the emitter electrode A of the transistor $Q_1$, and if the output voltage of the same filter $X_1$ is connected to the base electrode B of the same transistor $Q_1$, since the base electrode B is also supplied with a bias voltage, when the phase of the output voltage applied to the base electrode B is lagging the phase of the input voltage applied to the emitter electrode A, the collector current of the transistor is decreased, and when the phase of the voltage applied to B is leading the phase of the voltage applied to the emitter electrode A, the collector current will be increased. Accordingly, the output voltage $V_1$ from the collector electrode of the transistor $Q_1$ is decreased or increased in proportion to the difference between the phases of the input and output voltages of the band pass filter $X_1$. A capacitor $C_3$ is connected to the output side of the transistor for removing the higher harmonics from the output voltage $V_1$. $R_1$ and $R_2$ determine the bias voltage for the base electrode B, and a resistor $R_3$ determines an input resistance of the emitter electrode A.

Figure 4:
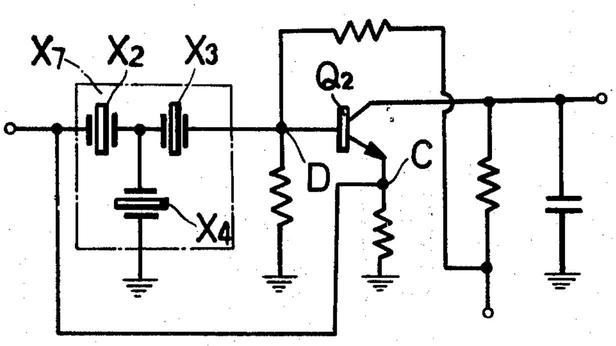
FIG. 4 is a circuit diagram of another FM detecting circuit constituting another embodiment of the invention, wherein three piezoelectric resonators having two electrodes are employed.

FIG. 4 shows another embodiment of the present invention, wherein three piezoelectric resonators having two electrodes $X_2$, $X_3$ and $X_4$ are employed instead of the above described piezoelectric resonator having three electrodes $X_1$ shown in FIG. 3 for constituting a band pass filter $X_7$, and in this case also the input voltage of the band pass filter $X_7$ is applied to the emitter electrode C of a transistor $Q_2$ which is substantially similar to the transistor $Q_1$ and the output voltage of the same band pass filter $X_7$ is applied to the base electrode D of the same transistor $Q_2$. In this circuit the output voltage $V_2$ of the transistor $Q_2$ is increased or decreased in proportion to the difference between the phases of the input and the output voltage of the band pass filter $X_7$, whereby the phase detection of the input voltage can be achieved.

In the two above described embodiments of the present invention, since the relation between the voltages applied at A and B or C and D is utilized for the detection, a reversed application of these voltages, for instance, connecting the output of the filter to A or C and the input of the filter to B or D, may also constitute a detecting circuit similar to those described above.

Although merely one transistor is employed in the above described two embodiments, using two transistors can constitute more powerful detecting circuit and the waveform distortion in the audio frequency range may be more fully improved.

Figure 5:
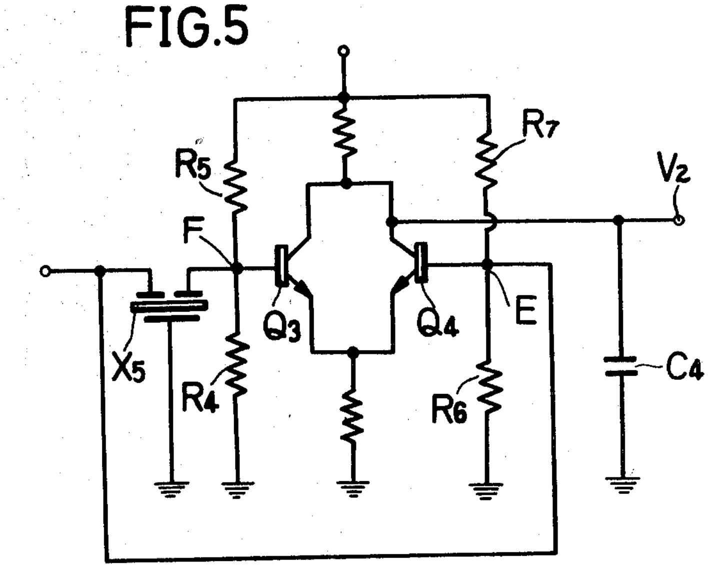
FIG. 5 is a circuit diagram of the FM detecting circuit constituting still another embodiment of the invention, wherein two transistors connected in parallel are employed.

FIG. 5 shows another FM detecting circuit wherein an amplifier composed of two transistors $Q_3$ and $Q_4$ connected in parallel to each other in a differential amplifier arrangement is employed with a piezoelectric band pass filter having three electrodes $X_5$. In this construction, the input of the band pass filter $X_5$ is applied to the base electrode E of the transistor $Q_4$ and the output of the band pass filter $X_5$ is applied to the base electrode F of another transistor $Q_3$. In this case, the base input impedance of the transistor $Q_3$ can be adjusted by resistors $R_4$ and $R_5$, and the base input impedance of the transistor $Q_4$ can be adjusted by resistors $R_6$ and $R_7$, whereby the impedance of this phase detecting circuit can be completely matched to the impedance of the band pass filter $X_5$. According to this embodiment, not only is good linearity in the detected output possible over a wide frequency range, but a larger output voltage having minimum distortion in the audio frequency can also be obtained.

Figure 6:
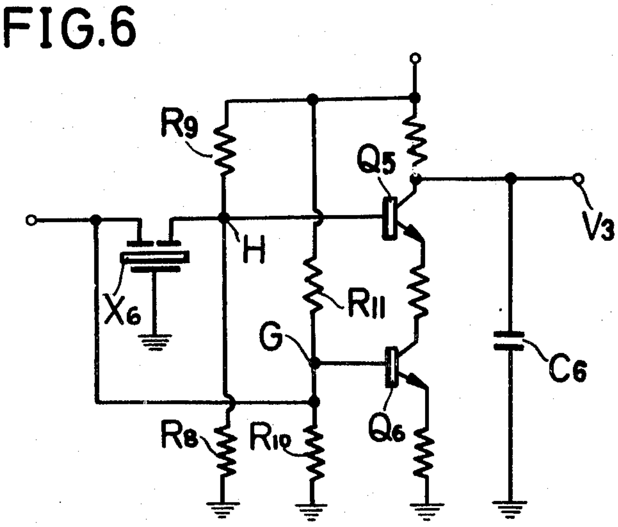
FIG. 6 is a circuit diagram of the detecting circuit of still another embodiment of the invention, wherein two transistors connected in series are employed.

FIG. 6 shows still another embodiment of the present invention, wherein a three electrodes type piezoelectric type band pass filter having three electrodes $X_6$ is connected to two transistors $Q_5$ and $Q_6$ which are connected in series. In this case, the input of the band pass filter $X_6$ is connected to the input G of the transistor $Q_6$ and the output of the band pass filter $X_6$ is connected to the input H of the other transistor $Q_5$. In this embodiment, since the base input impedance of a transistor $Q_5$ can be matched by the resistors $R_8$ and $R_9$, and the base input impedance of another transistor $Q_6$ can be matched by resistors $R_{10}$ and $R_{11}$, the phase detecting circuit of this embodiment can be completely matched to any desired piezoelectric type band pass filter $X_6$. According also to this embodiment, the linearity of the detected output can be improved. To be more particular, distortion in the audio frequency range of the output can be reduced, and a larger output voltage can be obtained.

Although the embodiments in FIGS. 5 and 6 show piezoelectric band pass filters having three electrodes, a band pass filter constructed by a plurality of piezoelectric resonators having two electrodes or a plurality of piezoelectric resonators having three electrodes can also be employed.

The following are examples of typical resonators constructed in accordance with this invention.

EXAMPLE 1

On the front surface of a polarized ceramic consisting of lead zirconate-lead titanate and having outside measurements of about 5 mm.×5 mm.×0.2 mm., split-type silver electrodes of approximately 0.75 mm. radius are provided, and on the rear side surface of the ceramic plate, a common electrode of about 1.5 mm. diameter is provided in a position opposing the split type electrodes on the front surface thereof. By this arrangement, a resonator having three electrodes having an energy trapped thickness expansion mode as shown in FIG. 3A could be obtained. This type of resonator was used together with the circuit shown in FIG. 3, so that a detecting characteristic as shown by full line in FIG. 3E could be obtained.

On the other hand, on the front and rear surfaces of the lead zirconate-lead titanate ceramic of the same outside measurements, a pair of confronting silver electrodes of about 1.5 mm. diameter, one on one side and the other on the other side, are provided so that a resonator having two electrodes and having thickness expansion energy trapped mode could be obtained. Such a piezoelectric resonator was employed in a conventional circuit shown in FIG. 1, and the detecting characteristic are shown by the broken line in FIG. 3E. While the conventional detecting circuit has a linear portion in a range of −50 to +50 kHz. around its center frequency 10.7 MHz., the detecting circuit according to the present invention has a linear portion in a wider range of −125 to +125 kHz. or more centered around a center frequency 10.7 MHz., and thus has a linearity 2.5 times wider than could be otherwise obtained.

EXAMPLE 2

The detecting characteristics of FM detecting circuit as shown in FIGS. 5 and 6 wherein a ceramic filter having three electrodes having a center frequency of 10.7 MHz. and bandwidth of 250 kHz. is employed as a band pass filter, are indicated by a line similar to the full line in FIG. 3E. Furthermore, when the output voltages and waveform distortion ratios in various embodiments of the phase detecting circuit are compared, following results as shown in the Table 1 were obtained. In these experiments, the input voltage was 1 volt and the FM modulation was performed with ±75 kHz. (100 percent).

TABLE 1

Figure 1:
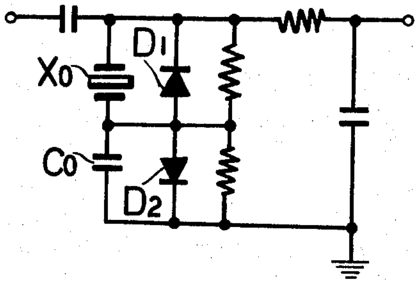
FIG.1 PRIOR ART
FIG. 1 is a circuit diagram of a conventional FM detecting circuit, which employs a piezoelectric resonator having a linear impedance versus frequency characteristic over a relatively narrow frequency band.

| Circuits<br>Characteristics | FIG. 1 | FIG. 3 | FIG. 5 | FIG. 6 |
|---|---|---|---|---|
| Output voltage | 50 mv. | 70 mv. | 130 mv. | 300 mv. |
| Waveform distortion ratios | 5.0% | 2.5% | 1.5% | 1.0% |

From the Table 1 it is apparent that the output characteristics of the FM detecting circuit could be significantly improved by the present invention.

Since the detecting circuit according to the present invention is composed of a piezo-electric type band pass filter and transistors as its principal elements, the detecting circuit can be made into small size, can be combined into various instruments without requiring any adjustment, and can have superior operating characteristics as described above. Thus, the detecting circuit according to the present invention can be widely employed in audio detectors in television and detecting circuits in FM radios particularly in view of the I.C. constructions of these circuits.

What is claimed is:

1. A circuit for detecting frequency modulated signals comprising:
   a band pass filter, having an input for receiving said frequency modulated signals and an output, composed of at least one piezoelectric resonator circuit having an input electrode connected to said input an output electrode connected to said output, and a reference potential electrode connected to a reference potential, and further having piezoelectric plate means disposed between said reference potential electrode and said input and output electrodes; and
   means, connected to said input and to said output, for providing a signal proportional to the phase difference between signals delivered to said input and output of said band pass filter respectively, said means comprising a transistor circuit having at least one transistor, said at least one transistor having a first electrode connected to said input and a second electrode connected to said output, whereby said transistor circuit produces a detected output representative of the variation of the frequency of the signal delivered to the input of said band pass filter.

2. A circuit according to claim 1, wherein said transistor circuit comprises a single transistor, the base electrode of which is connected to the output of said band pass filter and the emitter electrode of which is connected to the input of said band pass filter.

3. A circuit according to claim 1, wherein said transistor circuit comprises a single transistor, the emitter electrode of which is connected to the output of said band pass filter and the base electrode of which is connected to the input of said band pass filter.

4. A circuit according to claim 1, wherein said transistor circuit comprises a transistor differential amplifier having a pair of inputs and a differential output, one of said pair of inputs being connected to said input of said band pass filter and the other of said pair of inputs being connected to the output of said band pass filter.

5. A circuit according to claim 1, wherein said transistor circuit comprises a pair of transistors connected in series, one of the electrodes of each transistor in said pair being connected to the respective input and output of said band pass filter.

6. A circuit according to claim 1, wherein said piezoelectric resonator circuit comprises a plurality of interconnected piezoelectric resonators, each having two electrodes and a piezoelectric plate disposed between each of said two electrodes, while one electrode of each of said resonators is connected to a common junction and the other electrodes comprise said input, output and reference potential electrodes, respectively.

7. A circuit according to claim 6, wherein said plurality of interconnected resonators comprises a pair of resonators connected in series to form said filter, one resonator of said pair of resonators having one of its electrodes connected to said input and one electrode of the other resonator of said pair of resonators being connected to said output, and wherein said transistor circuit comprises a single transistor, the base electrode of which is connected to the base of said band pass filter and the emitter electrode of which is connected to the input of said band pass filter.

8. A circuit according to claim 6, wherein said plurality of interconnected resonators comprises a pair of resonators connected in series to form said filter, one resonator of said pair of resonators having one of its electrodes connected to said input and one electrode of the other resonator of said pair of resonators connected to said output and wherein said transistor circuit comprises a single transistor, the emitter electrode of which is connected to the output of said band pass filter and the base electrode of which is connected to the input of said band pass filter.

9. A circuit according to claim 4, wherein said piezoelectric resonator circuit comprises a plurality of interconnected piezoelectric resonators each having two electrodes and a piezoelectric plate disposed between each of said two electrodes, while one electrode of each of said resonators is connected to a common junction and the other electrodes comprise said input, output and reference potential electrodes, respectively.

10. A circuit according to claim 5, wherein said piezoelectric resonator circuit comprises a plurality of interconnected piezoelectric resonators each having two electrodes, and a piezoelectric plate disposed between each of said two electrodes, while one electrode of each of said resonators is connected to a common junction and the other electrodes comprise said input, output and reference potential electrodes respectively.

11. A circuit according to claim 1, wherein the output of said transistor circuit is connected to the collector of said transistor.

12. A circuit according to claim 5, wherein said pair of series connected transistors are connected to the respective inputs and outputs of said band pass filter at the bases thereof, and wherein the output of said series connected pair of transistors is taken from the collector of one of said transistors.

* * * * *